(12) United States Patent
Lee

(10) Patent No.: US 6,783,996 B2
(45) Date of Patent: Aug. 31, 2004

(54) CAPACITOR OF SEMICONDUCTOR DEVICE AND FABRICATION METHOD THEREOF

(75) Inventor: Seok-Won Lee, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 24 days.

(21) Appl. No.: 10/294,739

(22) Filed: Nov. 15, 2002

(65) Prior Publication Data

US 2003/0096474 A1 May 22, 2003

(30) Foreign Application Priority Data

Nov. 16, 2001 (KR) ........................................ 2001-71270

(51) Int. Cl.$^7$ ............................................. H01L 21/00
(52) U.S. Cl. .......................................................... 438/3
(58) Field of Search ..................... 438/3, 240; 257/295, 257/310

(56) References Cited

U.S. PATENT DOCUMENTS

| 5,767,543 A | 6/1998 | Ooms et al. ................ 257/315 |
| 6,197,600 B1 | 3/2001 | Kijima et al. ................... 438/3 |
| 6,204,070 B1 | 3/2001 | Kim ............................... 438/3 |
| 6,232,167 B1 | 5/2001 | Satoh et al. ................. 438/240 |
| 6,541,806 B2 * | 4/2003 | Hayashi et al. ............. 257/295 |

FOREIGN PATENT DOCUMENTS

KR        2000-27681        5/2000

* cited by examiner

*Primary Examiner*—David Nelms
*Assistant Examiner*—Quoc Hoang
(74) *Attorney, Agent, or Firm*—Birch, Stewart, Kolasch & Birch, LLP

(57) ABSTRACT

The present invention relates to a capacitor of a semiconductor device and to a method for its fabrication; and, more particularly, to a capacitor of a semiconductor device that can reduce current leakage and compensate for the Bi substances that have volatilized at a high temperature by providing an amorphous bismuth oxide layer at least at one of the upper and lower parts of a ferroelectric layer containing Bi or at both locations, and to a fabrication method therefor. The capacitor of the semiconductor device of the present invention comprises: a first electrode formed on a substrate; a ferroelectric layer containing bismuth formed on the first electrode; a second electrode formed on the ferroelectric layer containing bismuth; and an amorphous bismuth oxide layer positioned at least at one of the places between the first electrode and the ferroelectric layer and between the ferroelectric layer and the electrode or at both locations.

11 Claims, 1 Drawing Sheet

CAPACITOR OF SEMICONDUCTOR DEVICE AND FABRICATION METHOD THEREOF

BACKGROUND OF THE INVENTION

1. Field of the Invention

The present invention relates to a capacitor of a semiconductor device and a method for fabricating the same. More particularly, the present invention is directed to a capacitor that uses a material containing bismuth (Bi) such as $(Bi,La)_4Ti_3O_{12}$ (BLT), $SrBi_2Ta_2O_9$ (SBT) or $Sr_xBi_y(Ta_zNb_j)_2O_9$ (SBTN), as its dielectric substance, and to its method of fabrication.

2. Description of Related Art

Generally, research has been conducted to develop a device that provides a large capacity, which is required for a dynamic random access memory (DRAM) device, by using ferroelectrics for fabricating a capacitor of a semiconductor memory device.

A ferroelectric Random Access Memory (FeRAM) device employing a ferroelectric layer is a nonvolatile memory device. With the advantage of retaining stored information even when the electrical power is turned off and its operational speed just as fast as a DRAM, it stands in the spot light as the next-generation memory device.

The ferroelectrics used as dielectric substances for the FeRAM devices include $(Bi,La)_4Ti_3O_{12}$ (BLT), $SrBi_2Ta_2O_9$ (SBT), $Sr_xBi_y(Ta_zNb_j)_2O_9$ (SBTN), $Ba_xSr_{(1-x)}TiO_3$ (BST) and $Pb(Zr,Ti)O_3$ (PZT), that have the Perovskite structure. The ferroelectric layers are applied to nonvolatile memory devices because their dielectric constants are as big as several hundred to several thousand at room temperature, and exist in a state of having two stable remnant polarizations (Pr).

A nonvolatile memory device employing a ferroelectric layer makes use of the hysteresis property, which inputs a signal by controlling the direction of polarization towards that of an electric field supplied thereto and, when the electric field is removed, stores a digital signal '1' or '0' by the direction of the remaining remnant polarization (Pr).

Ferroelectrics such as BLT, SBT and SBTN have big dielectric constants, so they have the advantage that they can secure a sufficient capacitance in a small capacitor area when used as a cell capacitor of a memory device. For this reason, many studies are being conducted to develop a ferroelectric capacitor employing a BLT, SBT or SBTN thin layer as a cell capacitor in a memory device of several giga bits.

FIG. 1 is a cross-sectional view of a conventional ferroelectric capacitor using a material including Bi as its dielectric substance.

As illustrated in FIG. 1, the conventional method for fabricating a ferroelectric capacitor comprises the steps of: forming a first inter-layer insulation layer 12 on a semiconductor substrate 11 formed of transistors and bit lines (not shown); forming a contact mask that uses a photoresist on top of the first inter-layer insulation layer 12; and forming a contact hole that exposes a predetermined surface portion of the semiconductor substrate 11 by etching the first inter-layer insulation layer 12 with the contact mask.

Subsequently, polysilicon is formed on the first inter-layer insulation layer 12 including the contact hole, and a polysilicon plug 13 is formed in a predetermined part of the contact hole where it is recessed to a predetermined depth by performing an etch-back process.

Subsequently, titanium (Ti) is deposited on the entire surface and a rapid thermal process (RTP) is performed, and then Ti-silicide 14 is formed on the polysilicon plug 13 by the chemical reaction between the titanium and the silicon (Si) atom of the polysilicon plug 13. The Ti-silicide 14 forms an ohmic contact between the polysilicon plug 13 and the subsequent bottom electrode.

Thereafter, a TiN layer 15 is formed on the Ti-silicide 14. The TiN layer is polished chemically and mechanically (CMP) or etched back until the surface of the first inter-layer insulation layer 12 is exposed and made to remain in the contact hole only.

Here, the TiN layer 15 serves as a barrier metal that protects substances from being diffused from the bottom electrode into the polysilicon plug 13 or the semiconductor substrate 11.

After the formation of the TiN layer 15, an adhesive layer 16 is formed on the first inter-layer insulation layer 12 to improve the inter-layer adhesion, and a bottom electrode 17, a ferroelectric layer 18 containing bismuth (Bi) and top electrode 19 are formed in that order.

When forming the ferroelectric layer 18 containing bismuth (Bi) on the bottom electrode 17 formed of Pr, Ru, $RuO_2$, Ir, $IrO_2$, IrO or RuO, the ferroelectric layer 18 is deposited at a high temperature so as to be crystallized, or a subsequent thermal treatment process is conducted after the ferroelectric layer 18 containing bismuth (Bi) is deposited.

The reason for requiring the crystallization process is that when the ferroelectric layer 18 containing bismuth (Bi) has a polycrystalline structure, the ferroelectric layer 18 can manifest its properties as a ferroelectric material, such as remnant polarization and a large dielectric constant.

However, the crystallized ferroelectric layer has the shortcoming that its properties as a ferroelectric capacitor are degraded because its grain boundaries are used as conduction paths for the leakage of current, thus bringing about an increase in the leakage current and the dielectric loss.

Also, bismuth is the most volatile among the materials forming ferroelectric material. Therefore, when performing subsequent high temperature thermal treatments, the Bi on the surface of the ferroelectric layers may volatilize, thereby not manifesting the inherent properties of ferroelectric layers.

As described above, various methods have attempted to solve the problems of ferroelectric layers containing Bi, such as current leakage and deterioration of ferroelectric properties, for instance, by using diverse materials as electrodes or adding impurities, only to obtain so far unsatisfactory.

SUMMARY OF THE INVENTION

It is, therefore, an object of the invention to provide a capacitor of a semiconductor device and a fabrication method therefore that reduces current leakage and dielectric loss.

In accordance with an embodiment of the invention, there is provided a capacitor of a semiconductor device, comprising: a first electrode formed on a substrate; a ferroelectric layer containing bismuth formed on the first electrode; a second electrode formed on the ferroelectric layer containing bismuth; and an amorphous bismuth oxide layer positioned at, at least one of the locations between the first electrode and the ferroelectric layer and between the ferroelectric layer and the second electrode.

In accordance with an embodiment of the invention, there is provided a method for fabricating a semiconductor device, comprising the steps of: forming a first electrode on a substrate; forming a ferroelectric layer containing bismuth on the first electrode; performing a rapid thermal process (RTP) to crystallize the ferroelectric layer; forming a second electrode on the ferroelectric layer containing bismuth; forming an amorphous bismuth oxide layer positioned at, at least one of the places between the first electrode and the ferroelectric layer and between the ferroelectric layer and the second electrode.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

To solve the problem of a conventional ferroelectric capacitor, an amorphous bismuth oxide layer is formed as a thin layer either between the bottom electrode and the ferroelectric layer containing Bi, or between the ferroelectric layer containing Bi and the top electrode.

Compared to a ferroelectric layer having a polycrystalline structure, the amorphous thin layer has a small dielectric constant and does not manifest the properties as a ferroelectric layer. However, the amorphous thin layer has an advantage of producing a very small amount of current leakage and dielectric loss because no path for substance conduction is formed inside the amorphous thin layer. Moreover, as the leakage current is conducted to the outside of the device through electrodes, a conduction path of the leakage current can be blocked by forming an amorphous bismuth oxide layer between the ferroelectric layer containing Bi and the top electrode, or between the ferroelectric layer containing Bi and the bottom electrode.

The amorphous bismuth oxide layer does not have to be that thick in order to bring about this effect, so the influence of degrading properties on the ferroelectric capacitor caused by the decrease in the dielectric constant is considered insignificant.

In the invention, the amorphous bismuth oxide layer that contains Bi, the material forming the ferroelectric layer, is used to form the amorphous thin layer. With a delicate structure, the amorphous bismuth oxide layer can not only suppress Bi from volatilizing during the high temperature thermal treatment process, but it can compensate for the Bi that has already volatilized and can also improve the adhesion between the amorphous bismuth oxide layer and the ferroelectric layer as well.

Particularly, $Bi_2O_3$ as an amorphous thin layer, among other amorphous bismuth oxide layers, shows superior properties with its delicate structure and chemical stability.

Figure 1:
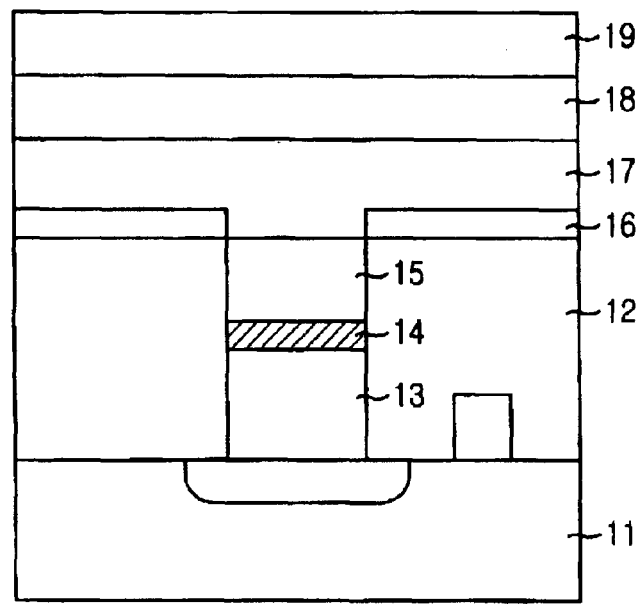
FIG. 1 is a cross-sectional view of a conventional capacitor.
Figure 2:
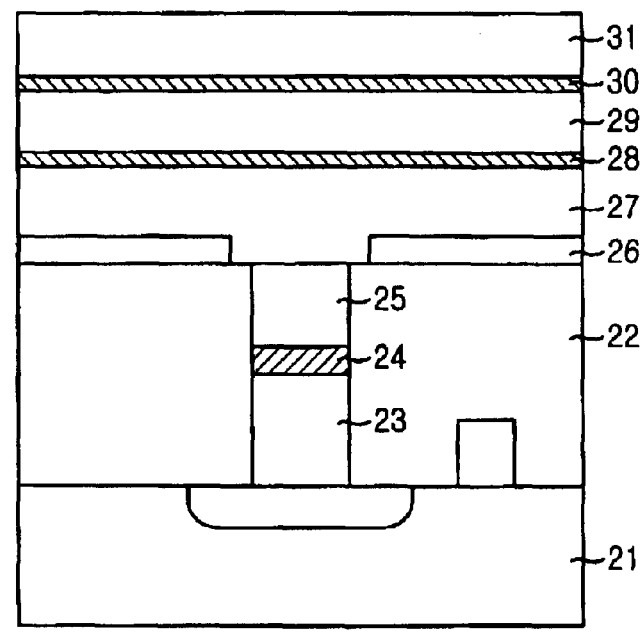
FIG. 2 is a cross-sectional view of a capacitor fabricated in accordance with the invention.

FIG. 2 is a cross-sectional view of a capacitor fabricated in accordance with an embodiment of the invention. With reference to the drawing, a capacitor of a semiconductor of the invention and a method for its fabrication will now be described.

The process up until the formation of the bottom electrode 27 is the same as that of the conventional method. After the bottom electrode 27 is formed, an amorphous bismuth oxide layer 28 is formed in a thickness of 10 nm to 30 nm on the bottom electrode 27. The amorphous bismuth oxide layer 28 can be formed by a physical deposition method such as sputtering or by a chemical deposition method such as, a metal organic chemical vapor deposition (MOCVD) method. The amorphous bismuth oxide layer 28 should be formed at a low temperature of around 300° C. so as not to be crystallized.

Subsequently, a ferroelectric layer 29 containing bismuth is formed on the amorphous bismuth oxide layer 28. As for the ferroelectric layer 29, BLT, SBT or SBTN can be used. The ferroelectric layer 29 containing bismuth is formed at a thickness of 50 nm to 300 nm so as to be formed thicker than the amorphous bismuth oxide layer 28.

The ferroelectric layer 29 containing bismuth is formed by using plasma enhanced chemical vapor deposition (PECVD) from room temperature to 600° C. in order not to crystallize the amorphous bismuth oxide layer 28 positioned under the ferroelectric layer 29.

After the formation of the ferroelectric layer 29 containing Bi, a subsequent thermal treatment process is carried out to crystallize the ferroelectric layer 29. Here, the thermal treatment process is performed by the rapid thermal process (RTP). Thus, even the RTP which is conducted in an atmosphere of oxygen at a temperature of 600° C. to 900° C., is performed for a very short time of about 30 seconds to two minutes to prevent the crystallization of the amorphous bismuth oxide layer 28.

Subsequently, another amorphous bismuth oxide layer 30 is formed at a thickness of 10 nm to 50 nm on the ferroelectric layer 29. The amorphous bismuth oxide layer 30 can be formed by using the physical deposition method like sputtering or by the chemical deposition method, such as the MOCVD, as described above. Also, it is applied at room temperature to about 300° C. to prevent the amorphous bismuth oxide layer 30 from being crystallized.

According to the invention, the amorphous bismuth oxide layer can be formed both on the upper and lower surfaces of the ferroelectric layer 29 containing bismuth, or either on the upper surface or the lower surface of the ferroelectric layer 29.

Finally, after forming a top electrode 31 composed of Pt, Ru, $RuO_2$, Ir, $IrO_2$, IrO or RuO on top of what has been previously formed and after patterning the top electrode 31 by the processes of photolithography and etching, a thermal treatment is carried out to stabilize the capacitor, thus finalizing the fabrication of the capacitor of the semiconductor capacitor.

When applied to a semiconductor capacitor and the fabrication method thereof, the invention can prevent a lowering in the reliability of a semiconductor device caused by leakage current and dielectric loss. It also has the effect of preventing degradation of the properties of the device that frequently occurs by the volatilization of Bi during the thermal treatment at high temperature. In short, the invention improves electric properties of a memory device and brings about stabilization by maintaining the inherent properties as a ferroelectric layer, thereby raising the reliability of the device.

While the invention has been described with respect to certain preferred embodiments, it will be apparent to those skilled in the art that various changes and modifications may be made without departing from the scope of the invention as defined in the following claims.

What is claimed is:

1. A method for fabricating a semiconductor device, comprising the steps of:

forming a first electrode on a substrate;

forming a ferroelectric layer containing bismuth on the first electrode;

performing a rapid thermal process (RTP) to crystallize the ferroelectric layer;

forming a second electrode on the ferroelectric layer containing bismuth; and forming an amorphous bismuth oxide layer at least at one of the positions between the first electrode and the ferroelectric layer and between the ferroelectric layer and the second electrode, wherein the ferroelectric layer is formed at a room temperature to 600° C.

2. The method as recited in claim 1, wherein the ferroelectric layer is formed of a material selected from the group consisting of $(Bi,La)_4Ti_3O_{12}$, $SrBi_2Ta_2O_9$ and $Sr_xBi_y(Ta_iNb_j)_2O_9$.

3. The method as recited in claim 1, wherein the rapid thermal process (RTP) is carried out in an atmosphere of oxygen.

4. The method as recited in claim 3, wherein the rapid thermal process (RTP) is carried out at a temperature of about 600° C. to 900° C. for about 30 seconds to two minutes.

5. The method as recited in claim 1, wherein the amorphous bismuth oxide layer is formed of $Bi_2O_3$.

6. The method as recited in claim 1, wherein the amorphous bismuth oxide layer is formed by a physical deposition method or by a chemical deposition method.

7. The method as recited in claim 1, wherein the amorphous bismuth oxide layer is formed at room temperature to about 300° C.

8. The method as recited in claim 1, wherein the ferroelectric layer is formed in a thickness of 50 nm to 300 nm.

9. The method as recited in claim 1, wherein the ferroelectric layer is formed in a plasma enhanced chemical vapor deposition method.

10. The method as recited in claim 1, wherein the amorphous bismuth oxide layer between the first electrode and the ferroelectric layer is formed in a thickness of about 10 nm to 30 nm.

11. The method as recited in claim 1, wherein the amorphous bismuth oxide layer between the ferroelectric layer and the second electrode is formed in a thickness of about 10 nm to 50 nm.

* * * * *